United States Patent [19]
Ogle

[11] Patent Number: 5,994,236
[45] Date of Patent: Nov. 30, 1999

[54] PLASMA SOURCE WITH PROCESS NONUNIFORMITY IMPROVED USING FERROMAGNETIC CORES

[76] Inventor: John Seldon Ogle, 1472 Pashote Ct., Milpitas, Calif. 95035

[21] Appl. No.: 09/012,741

[22] Filed: Jan. 23, 1998

[51] Int. Cl.⁶ .................................................. H01L 21/00
[52] U.S. Cl. ............................ 438/728; 156/345; 216/70; 438/732
[58] Field of Search .................. 438/9, 14, 726, 438/727, 728, 732; 156/345 C, 345 MW, 345 ME, 345 MG, 345 MT; 216/68, 69, 70

[56] References Cited

U.S. PATENT DOCUMENTS

| | | | |
|---|---|---|---|
| 4,948,458 | 8/1990 | Ogle | 156/643 |
| 5,226,967 | 7/1993 | Chen | 118/723.1 |
| 5,277,751 | 1/1994 | Ogle | 156/643 |
| 5,346,578 | 9/1994 | Benzing | 156/345 |
| 5,368,710 | 11/1994 | Chen | 204/192.32 |
| 5,401,350 | 3/1995 | Patrick et al. | 156/345 |
| 5,622,635 | 4/1997 | Cuomo et al. | 216/70 X |
| 5,690,781 | 11/1997 | Yoshida | 156/345 |

*Primary Examiner*—William Powell

[57] ABSTRACT

The present invention uses the placement of ferromagnetic cores to improve the nonuniformity of plasma processing and to increase the energy transfer efficiency of plasma sources which couple energy to a plasma through the use of radio frequency current flowing through a coil adjacent to a dielectric window. In addition, eddy current conductive elements can be used either alone or in combination with ferromagnetic cores to increase the nonuniformity adjustment range.

11 Claims, 4 Drawing Sheets

PLASMA SOURCE WITH PROCESS NONUNIFORMITY IMPROVED USING FERROMAGNETIC CORES

CROSS REFERENCES TO RELATED APPLICATIONS

The invention of this application is an improvement on the inventions of my U.S. Pat. Nos. 4,948,458, granted Aug. 14, 1990, and 5,277,751, granted Jan. 11, 1994.

BACKGROUND—FIELD OF INVENTION

This invention relates to plasma sources used in processing semiconductor wafers, specifically to plasma sources using coils coupling magnetic energy through a dielectric window with improved process nonuniformity.

BACKGROUND—DESCRIPTION OF PRIOR ART

The increasing requirement for small feature size in semiconductor device manufacture has led to the use of plasma sources with energy coupled to a low pressure plasma through a varying magnetic field. Typical magnetic coupled plasma sources which use coils with windings adjacent to dielectric windows are described in U.S. Pat. No. 4,948,458 to Ogle, John S., (Aug. 14, 1990); U.S. Pat. No. 5,277,751 to Ogle, John S., (Jan. 11, 1994); U.S. Pat. No. 5,226,967 to Chen, Ching-Hwa; Liu, David; Tran, Duc (Jul. 13, 1993); U.S. Pat. No. 5,690,781 to Kazuyoshi, Yoshida; Miyamoto, Hidenobu, (Nov. 25, 1997); and U.S. Pat. No. 5,346,578 to Benzing, Jeffrey C.; Broadbent, Eliot K.; and Rough, Kirkwood H., (Sep. 13, 1994). Radio frequency current flowing through these coils results in varying magnetic fields which extend through the dielectric windows into chambers containing the desired low pressure gases. This varying magnetic field accelerates free electrons to the ionization energy of the gas molecules, which generates the plasma.

Variations in plasma density result in unacceptable process nonuniformity variations, especially with the larger semiconductor wafer sizes now coming into use. While systematic variations in process nonuniformity can be corrected by introducing local variations in pitch between coil turns, this coil adjustment procedure is time consuming and expensive, and the optimum coil adjustment may vary with process conditions, such as gas pressure or flow.

An alternate method for improving radial nonuniformity is the use of dielectric windows which are thicker near the center than near the edge of the window, as described in U.S. Pat. Nos. 5,226,967; 5,368,710; and 5,690,781. While using a window with radially varying thickness can improve a systematic process nonuniformity, it reduces the plasma generation efficiency by requiring higher coil currents to compensate for the additional distance between the coil and the plasma. In addition, varying the thickness of the window is not a convenient method of compensating for non-systematic process nonuniformities.

U.S. Pat. No. 5,690,781 attempts to increase the flexibility of nonuniformity correction by combining a radially varying thickness dielectric window with a means for varying the position of the coil relative to the window. While this results in the possibility of slight process nonuniformity improvement, it does not provide for completely independent uniformity improvement throughout the semiconductor wafer, and the increased distance between the coil and the plasma results in even poorer energy transfer efficiency from the coil to the plasma.

U.S. Pat. No. 5,346,578 shows the use of a dome shaped dielectric window with a conforming dome shaped coil to improve process nonuniformity by using the increased distance between the plasma generation area near the center of the coil and the wafer, relative to the distance between the plasma generation area near the periphery of the dome shaped coil and the wafer. This increased distance from the plasma generation region and the center of the wafer reduces the plasma effectiveness near the center of the wafer. Since the plasma density near the walls of the chamber is reduced as a result of the chamber walls capturing free electrons, this reduction in plasma effectiveness near the center of the wafer results in improved nonuniformity. As in the plasma sources using varying thickness windows, this improvement in nonuniformity is achieved at the cost of reduced energy transfer efficiency from the coil to the region adjacent to the wafer. In addition, making adjustments to further optimise nonuniformity is very time consuming and expensive, and since the plasma volume is much larger than with a planar plasma source, the time required to pump the gas to low pressures is increased.

OBJECTS AND ADVANTAGES

Accordingly, the primary object and advantage of my invention is to provide a method for improving plasma process nonuniformity by using ferromagnetic cores to adjust the shape of the varying magnetic field from a magnetically coupled plasma source using an energy coupling coil adjacent to a dielectric window.

An additional object is to improve the efficiency of energy coupling from the energy coupling coil to the plasma.

An additional object is to provide a convenient tuning capability for tuning the plasma source.

Still further objects and advantages will become apparent from a consideration of the ensuing description and accompanying drawings.

Figure 1:
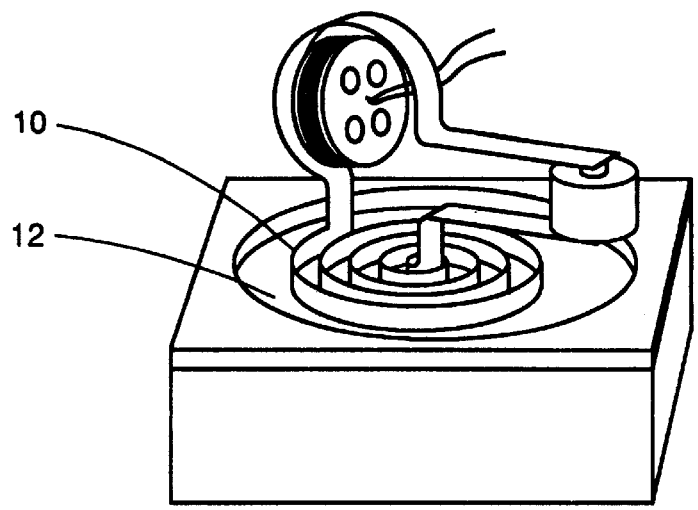
FIG. 1 is a perspective view of a prior art plasma source using radio frequency current through a substantially planar spiral coil to couple magnetic energy through a dielectric window into a plasma.

REFERENCE NUMERALS 10 substantially planar spiral coil
12 dielectric window
14 side flattened solenoidal coil
16 radially varying thickness dielectric window
20 four coil turns
24 rectangular ferromagnetic core
26 ferromagnetic core ring
28 multiple turn fitted ferromagnetic core
29 single turn fitted ferromagnetic core
30 eddy current conductive element
32 magnetic flux
34 increased magnetic flux
36 slightly further increased magnetic flux
38 decreased magnetic flux
40 dome shaped energy coupling coil
42 dome shaped dielectric window

SUMMARY

A method of plasma process nonuniformity improvement, efficiency improvement, and the addition of tuning capability in a plasma source which uses a coil to couple varying magnetic field energy through a dielectric window into a reduced pressure plasma chamber, comprises the addition and positioning of ferromagnetic cores and/or eddy current conductive elements on the side of the coil turns opposite to the dielectric window.

PREFERRED EMBODIMENT—DESCRIPTION

FIG. 1 is a perspective view of the prior art plasma source described in U.S. Pat. No. 4,948,458, which uses substantially planar spiral coil 10 adjacent to dielectric window 12 to couple magnetic energy through dielectric window 12 into a plasma in a partially evacuated chamber.

Figure 2:
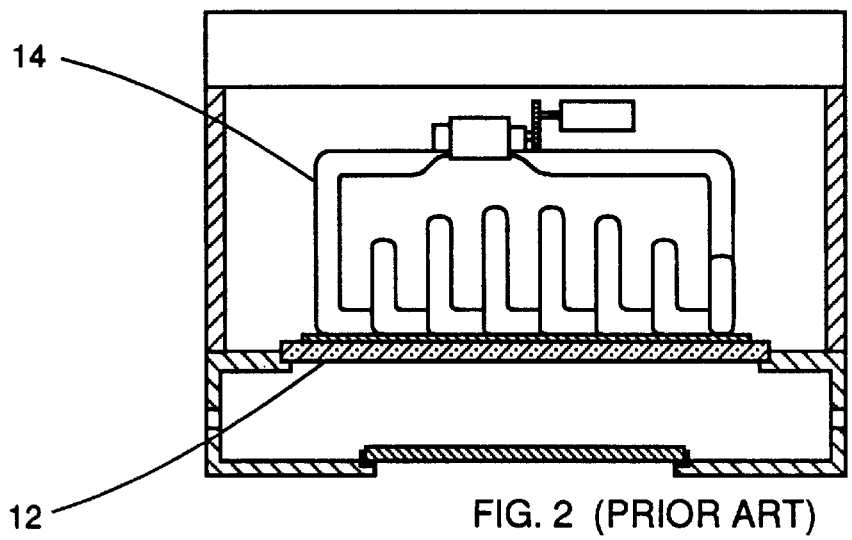
FIG. 2 is a side view of a prior art plasma source using an energy coupling coil with its axis parallel to the surface of a dielectric window to couple magnetic energy into a plasma.

FIG. 2 is a side view of the prior art plasma source described in U.S. Pat. No. 5,277,751, which uses side flattened solenoidal coil 14 with its axis parallel to the surface of dielectric window 12 to couple magnetic energy through dielectric window 12 into a plasma in a partially evacuated chamber.

Figure 3:
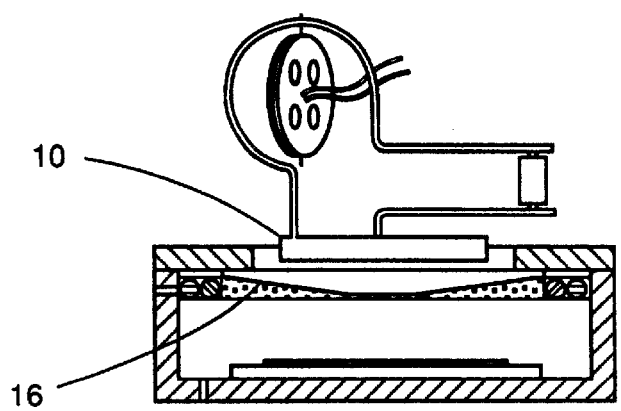
FIG. 3 is a side view of a prior art plasma source using the spiral coil of FIG. 1 with a radially varying thickness dielectric window to reduce the magnetic flux density near the center to improve process nonuniformity.

FIG. 3 is a side view of a prior art plasma source described in U.S. Pat. No. 5,226,967, which uses radially varying thickness dielectric window 16 with substantially planar spiral coil 10 of FIG. 1 to improve process nonuniformity by decreasing the magnetic energy passing through the thicker center part of radially varying thickness dielectric window 16.

Figure 4A:
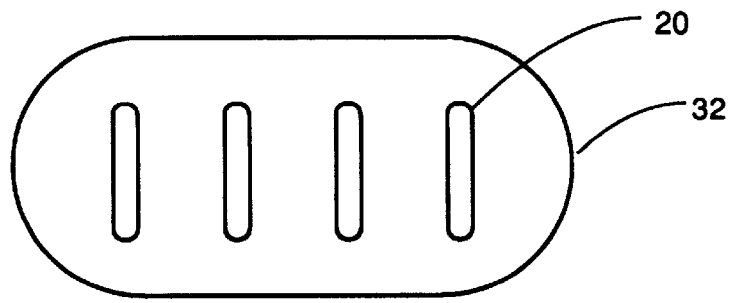
FIG. 4A is a cross sectional view showing four turns of a coil using vertically oriented flat conductors and an indication of the magnetic flux density resulting from radio frequency current flowing through these four coil turns.

FIG. 4A shows a cross sectional view of four coil turns 20, using vertically oriented flat conductors, with an indication of magnetic flux 32 resulting from current flowing through four coil turns 20.

Figure 4B:
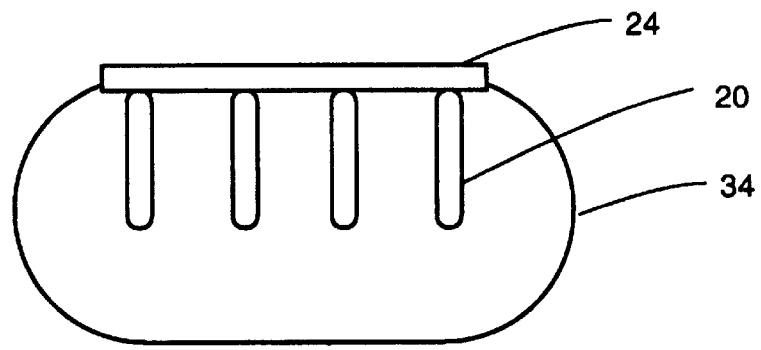
FIG. 4B shows the four coil turns of FIG. 4A, with a ferromagnetic core placed above the these four coil turns, and an indication of increased magnetic flux density below the coil turns resulting from the ferromagnetic core.

FIG. 4B shows a cross sectional view of four coil turns 20, with an indication of increased magnetic flux 34 below four coil turns 20 resulting from the decreased reluctance of rectangular ferromagnetic core 24 placed above and adjacent to four coil turns 20.

Figure 4C:
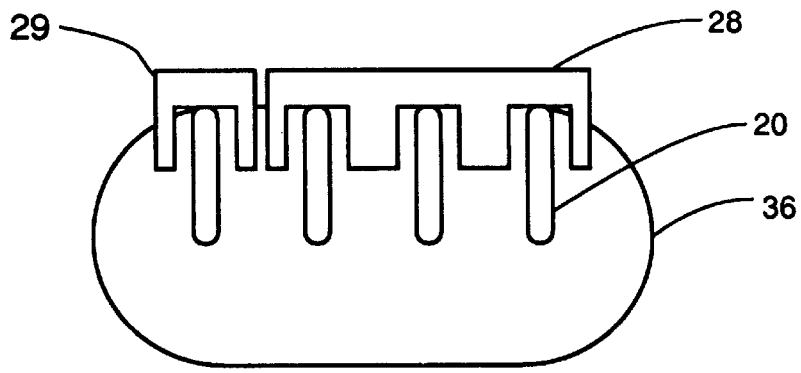
FIG. 4C shows the four coil turns of FIG. 4A, with a multiple turn and a single turn fitted ferromagnetic core mounted around the top parts of these four coil turns and an indication of further increased magnetic flux density below these four coil turns resulting from the fitted ferromagnetic cores.

FIG. 4C shows a cross sectional view of four coil turns 20, with an indication of slightly further increased magnetic flux 36 below four coil turns 20, resulting from the further decreased reluctance of multiple turn fitted ferromagnetic core 28 and single turn fitted ferromagnetic core 29 above and partially encircling the tops of four coil turns 20.

Figure 4D:
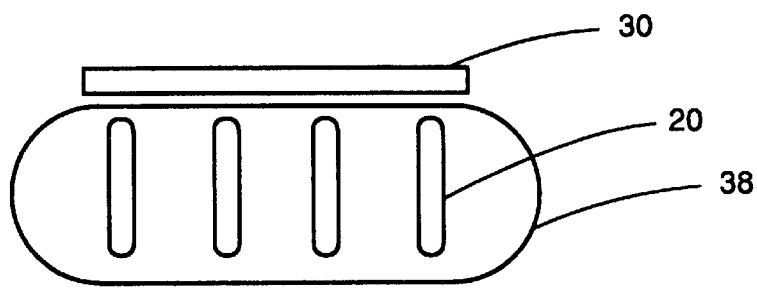
FIG. 4D shows the four coil turns of FIG. 4A, with an eddy current conductive element placed above the four coil turns, and an indication of the decreased magnetic flux density below the coil turns resulting from the eddy current conductive element.

FIG. 4D shows a cross sectional view of four coil turns 20, with decreased magnetic flux 38 below four coil turns 20 resulting from an opposing magnetic field caused by current induced in eddy current conductive element 30 above and adjacent to four coil turns 20.

Figure 5:
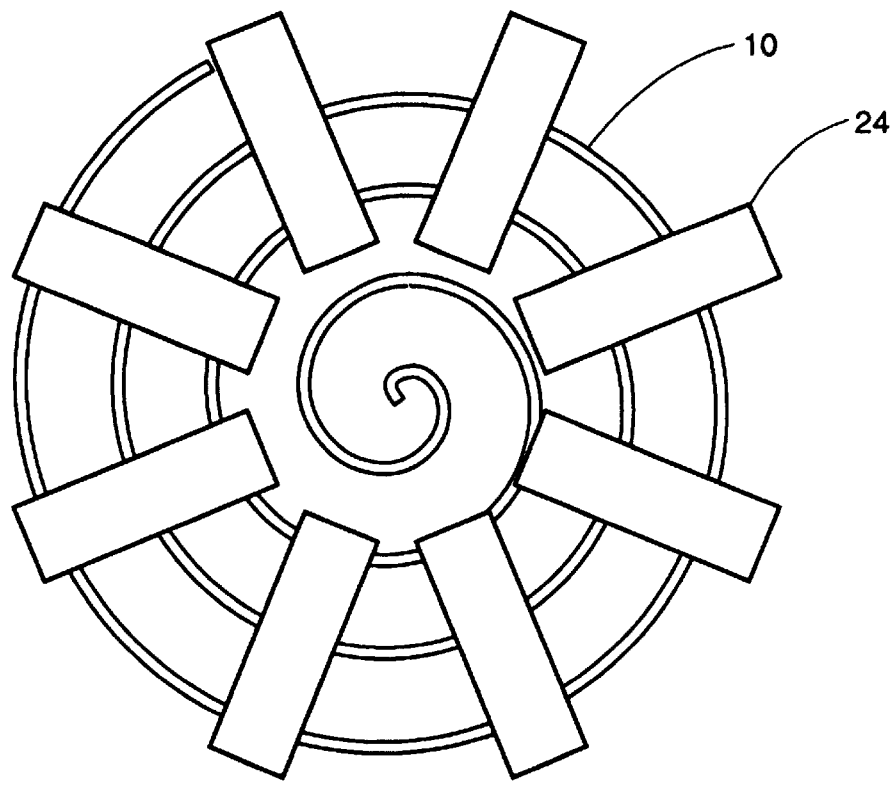
FIG. 5 is a plan view of the substantially planar spiral coil of FIG. 1 showing the placement of multiple rectangular ferromagnetic cores to improve process uniformity and energy transfer efficiency.

FIG. 5 is a plan view of substantially planar spiral coil 10 with multiple rectangular ferromagnetic core 24 units placed to provide increased magnetic flux away from the center of substantially planar spiral coil 10 to provide improved process nonuniformity.

Figure 6:
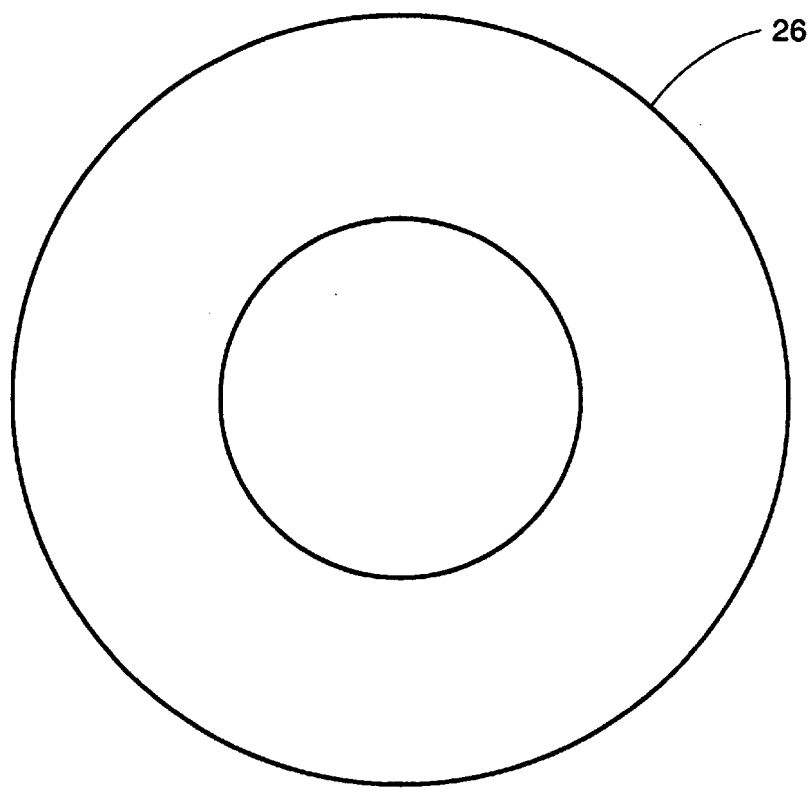
FIG. 6 is a plan view of a washer shaped ferromagnetic core ring which can be used in place of the multiple rectangular ferromagnetic cores of FIG. 5.

FIG. 6 is a plan view of washer shaped ferromagnetic core ring 26 which can be used in place of multiple rectangular ferromagnetic core 24 units shown in FIG. 5.

Figure 7:
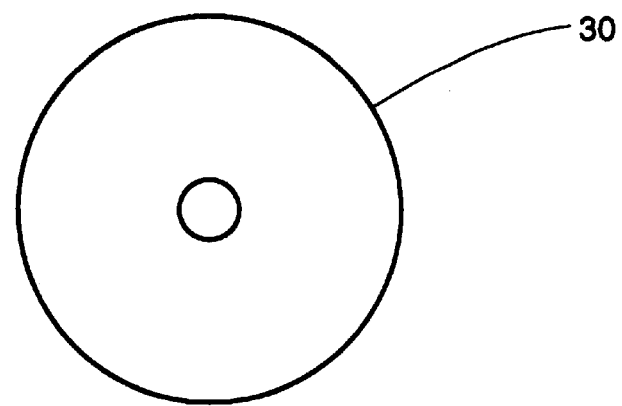
FIG. 7 is a plan view of an eddy current conductive element in the form of disk with a center hole, to provide improved process uniformity by reducing the magnetic flux below the center of a spiral coil.

FIG. 7 is a plan view of eddy current conductive element 30 in the form of a disk with a center hole.

Figure 8:
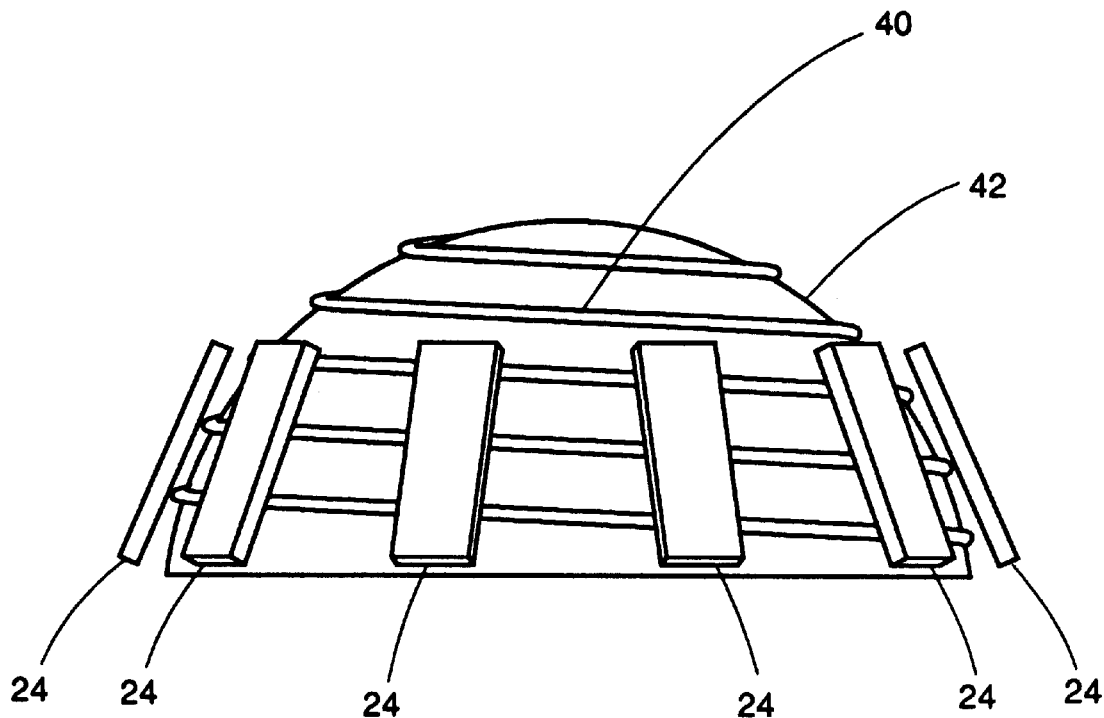
FIG. 8 is a side view of a dome shaped dielectric window with a conformally mounted dome shaped spiral coil and multiple rectangular ferromagnetic cores placed around the periphery of the dome shaped spiral coil to improve process uniformity and energy transfer efficiency.

FIG. 8 is a side view of dome shaped energy coupling coil 40 conformally fitted to dome shaped dielectric window 42, with multiple rectangular ferromagnetic core 24 units spaced around the outside periphery of dome shaped energy coupling coil 40 to increase the magnetic flux inside and near the edge of dome shaped dielectric window 42, thus improving process uniformity and energy transfer efficiency.

The use of a combination of eddy current conductive element 30 and ferromagnetic core ring 26 with substantially planar spiral coil 10 can provide increased radial nonuniformity adjustment flexibility.

Moving both eddy current conductive element 30 and ferromagnetic core ring 26 toward substantially planar spiral coil 10 increases the radial process nonuniformity variation. Moving eddy current conductive element 30 toward substantially planar spiral coil 10 decreases the inductance of substantially planar spiral coil 10, while moving ferromagnetic core ring 26 toward substantially planar spiral coil 10 increases the inductance of substantially planar spiral coil 10. Thus, moving both eddy current conductive element 30 and ferromagnetic core ring 26 in unison results in maximum magnetic field radial nonuniformity variation with minimum change in the inductance of substantially planar spiral coil 10.

Similarly, moving ferromagnetic core ring 26 toward substantially planar spiral coil 10 while moving eddy current conductive element 30 away from substantially planar spiral coil 10 can result in substantially constant nonuniformity correction while increasing the inductance of substantially planar spiral coil 10, thus providing the capability to tune the plasma source independent of the nonuniformity adjustment.

Suitable ferromagnetic core materials for this application have low losses at the operating frequencies and relative permeabilities preferably greater than 10. The M2 ferrite material from National Magnetics Group, Inc., 1210 Win Drive, Bethlehem, Pa. 18017-7061, has a relative permeability of 40 and is satisfactory at 13.56 Mhz.

Suitable materials for eddy current conductive element 30 include silver, copper, and aluminum.

Placing rectangular ferromagnetic core 24 above and adjacent to turns of a coil which carries radio frequency current typically increases the magnetic flux density below the coil by about 20%. Placing eddy current conductive element 30 above and adjacent to turns of a coil carrying radio frequency current in the same direction typically decreases the magnetic flux density below the coil by about 10%. Placing eddy current conductive element 30 above and adjacent to turns of a coil carrying radio frequency current in opposite directions, as in the center of substantially planar spiral coil 10, results in a greater decrease in magnetic flux below substantially planar spiral coil 10.

For the case of turns of a coil carrying radio frequency current in opposite directions, as in the center of substantially planar spiral coil 10, eddy current conductive element 30 can take the form of a conductive ring with the same periphery as eddy current conductive element 30, with no decrease in effectiveness.

PREFERRED EMBODIMENT—OPERATION

The configuration of process nonuniformity is determined, either by evaluating processed wafers or by scanning the plasma for nonuniformity, and units of rectangular ferromagnetic core 24 are placed above substantially planar spiral coil 10 in the areas where increased magnetic flux 34 is desired. This process is repeated until the nonuniformity reaches a satisfactorily low value. If the increased magnetic flux 34 is too great by placing rectangular ferromagnetic core 24 adjacent to substantially planar spiral coil 10, smaller rectangular ferromagnetic core 24 units can be used, or the same rectangular ferromagnetic core 24 can be spaced a distance above substantially planar spiral coil 10. Nonmagnetic and nonconductive clamps may be used to hold each rectangular ferromagnetic core 24 in place relative to substantially planar spiral coil 10.

OTHER EMBODIMENTS

Motor controlled ferromagnetic core positioning—Description

Multiple motor and position feedback sense means can be used under computer control to position multiple rectangular ferromagnetic core 24 units for optimum ferromagnetic core position patterns for each operating condition.

Motor controlled ferromagnetic core positioning—Operation

A pattern of rectangular ferromagnetic core 24 positions relative to an energy coupling coil can be determined for all process conditions of interest. For each process condition each rectangular ferromagnetic core 24 unit can be driven to the optimum position, using each motor and position feedback sense means, preferably under computer control.

Ferromagnetic ring cores and eddy current disks with a planar spiral coil—Description A ferromagnetic core ring 26 unit is placed adjacent to the periphery of substantially planar spiral coil 10. An eddy current conductive element 30 is placed adjacent to the center of substantially planar spiral coil 10.

Ferromagnetic ring cores and eddy current disks with substantially planar spiral coil—Operation The maximum effect on radial nonlinearity can be achieved by moving both ferromagnetic core ring 26 and eddy current conductive element 30 toward substantially planar spiral coil 10. The maximum increase of inductance for an energy coupling coil can be achieved by moving ferromagnetic core ring 26 toward substantially planar spiral coil 10 and moving eddy current conductive element 30 away from substantially planar spiral coil 10. The ferromagnetic core ring 26 and the eddy current conductive element 30 are both moved toward substantially planar spiral coil 10 until the desired nonuniformity adjustment is achieved. If it is desired to increase the inductance of substantially planar spiral coil 10, ferromagnetic core ring 26 can be moved toward substantially planar spiral coil 10 and eddy current conductive element 30 can be moved away from substantially planar spiral coil 10.

Ferromagnetic Cores with Dome Shaped Coil—Description

Units of rectangular ferromagnetic core 24 are placed adjacent to the periphery of dome shaped energy coupling coil 40 which conforms to dome shaped dielectric window 42.

Ferromagnetic Cores with Dome Shaped Coil—Operation

The use of rectangular ferromagnetic core 24 units around and outside the periphery of dome shaped energy coupling coil 40 increases the magnetic field energy coupling around the periphery of dome shaped dielectric window 42, thus allowing the use of a shallower dome shaped dielectric window 42 for the same process nonuniformity, reducing the volume of the process chamber, and reducing the time necessary for chamber pumping.

Fitted Ferromagnetic Cores—Description

The use of multiple turn fitted ferromagnetic core 28 units which partially fit around the tops of multiple turns of substantially planar spiral coil 10 can be used to slightly increase the nonuniformity correcting effect over the use of rectangular ferromagnetic core 24 units, especially with coil turns flattened as in four coil turns 20.

Similarly, the use of a single turn fittled ferromagnetic core 29 around the top of an individual conductor can be used to increase the magnetic flux density directly below that individual conductor, which can provide local nonuniformity adjustment Fitted Ferromagnetic Cores—Operation The fitted ferromagnetic core 28 units which fit partially around turns of substantially planar spiral coil 10 operate the same as the ordinary rectangular ferromagnetic core 24 units, with slightly increased nonuniformity adjustment. Disadvantages to using fitted ferromagnetic core 28 units which fit partially around turns of substantially planar spiral coil 10 are that fine adjustments in the radial positioning of fitted ferromagnetic core 28 units relative to the turns of substantially planar spiral coil 10 are no longer convenient.

CONCLUSIONS, RAMIFICATIONS, AND SCOPE

Accordingly, it can be seen that the addition and positioning of ferromagnetic cores above a coil adjacent to a dielectric window can be used to improve process nonuniformities by increasing the varying magnetic field in the plasma region below the coil in the vicinity of each ferromagnetic core. The addition of ferromagnetic cores as described also improves energy transfer efficiency from the coil to the plasma.

The addition and positioning of eddy current conductive elements above a coil adjacent to a dielectric window can similarly be used to correct process nonuniformities by decreasing the varying magnetic field in the plasma region below the coil in the vicinity of the eddy current conductive element.

The addition of both a ferromagnetic ring and an eddy current conductive disk above and adjacent to a coil provides the capability of independently adjusting for optimum nonuniformity and adjusting the inductance of the coil.

Although the description above contains many specificities, these should not be construed as limiting the scope of the invention but as merely providing illustrations of some of the presently preferred embodiments of this invention. Various other embodiments and ramifications are possible within it's scope. For example, for a plasma source using a coil with its axis parallel to the surface of a window, plasma uniformity can be adjusted using ferromagnetic cores adjacent to the part of the coil next to the dielectric window, and source tuning can simultaneously be accomplished by moving ferromagnetic cores adjacent to the part of the coil remote from the dielectric window.

Thus the scope of the invention should be determined by the appended claims and their legal equivalents, rather than by the examples given.

What is claimed is:

1. A plasma source using coil turns adjacent to a dielectric window for passing varying magnetic fields from said coil turns through said dielectric window to produce a plasma in a reduced pressure process chamber, with additions comprising:

at least one ferromagnetic core placed adjacent to said coil turns on the side of said coil turns opposite to said dielectric window.

2. The plasma source of claim 1, wherein:

means are provided for adjusting and fixing the positions of said at least one ferromagnetic core.

3. The plasma source of claim 1, wherein:

means are provided for changing the positions of each of said at least one ferromagnetic core to any one of several preset position patterns.

4. The plasma source of claim 1, wherein:

means are provided for motor drive positioning of said at least one ferromagnetic core; and means are provided for sensing the positions of said at least one ferromagnetic core.

5. The plasma source of claim 1, wherein:

said at least one ferromagnetic core include a ring core of ferromagnetic material.

6. A plasma source using coil turns adjacent to a dielectric window for passing varying magnetic fields from said coil turns through said dielectric window to produce a plasma in a reduced pressure process chamber, with additions comprising:

at least one eddy current conductive element adjacent to said coil turns on the side of said coil turns opposite to said dielectric window.

7. The plasma source of claim 1 further including at least one eddy current conductive element adjacent to said coil turns on the side of said coil turns opposite to said dielectric window.

8. Multiple units of the plasma source of claim 1 arranged to generate a plasma in a single partially evacuated chamber.

9. The plasma source of claim 1 wherein said at least one ferromagnetic core is shaped to fit around the top portion of at least one of said coil turns.

10. The plasma source of claim 1 wherein said at least one ferromagnetic core is made up of ferromagnetic core strips separated by spaces for cooling of said ferromagnetic core strips by the flow of air, nitrogen, water, antifreeze, or other cooling fluids between said ferromagnetic core strips.

11. A method for improving process nonuniformity in a plasma source using coil turns adjacent to a dielectric window for passing varying magnetic fields from said coil turns through said dielectric window to produce a plasma in a reduced pressure process chamber, consisting of the steps of conducting the plasma process; then measuring the process nonuniformity; then placing ferromagnetic cores adjacent to said coil turns on the side of said coil turns opposite to said dielectric window in the areas which require increased process activity; then repeating this sequence of steps until satisfactory nonuniformity is achieved.

* * * * *